United States Patent [19]

McAuley

[11] Patent Number: 5,115,436
[45] Date of Patent: May 19, 1992

[54] FORWARD ERROR CORRECTION CODE SYSTEM

[75] Inventor: Anthony J. McAuley, Rockaway, N.J.

[73] Assignee: Bell Communications Research, Livingston, N.J.

[21] Appl. No.: 521,114

[22] Filed: May 4, 1990

[51] Int. Cl.$^5$ .............................................. G06F 11/10
[52] U.S. Cl. ................................................... 371/37.1
[58] Field of Search .................... 371/37.1, 38.1, 39.1, 371/35

[56] References Cited

U.S. PATENT DOCUMENTS

| | | | |
|---|---|---|---|
| 4,586,183 | 4/1986 | Wilkinson | 371/38.1 |
| 4,809,275 | 2/1989 | Inoue | 371/37.1 |
| 4,835,775 | 5/1989 | Seroussi | 371/37.1 |
| 4,852,098 | 7/1989 | Brechard | 371/37.1 |
| 4,866,654 | 9/1989 | Yamada | 371/37.1 X |
| 4,939,733 | 7/1990 | Furutani | 371/371.1 X |
| 4,958,348 | 9/1990 | Berlekamp | 371/37.1 |
| 5,007,067 | 4/1991 | Ayanoglu | 371/68.2 X |

OTHER PUBLICATIONS

"Influence of LSI and VLSI Technology on the Design of Error-Correction Coding Systems", P. G. Farrell, *IEE Proc.*, vol. 129, Pt.F, No. 5, pp. 323-326, Oct. 1982.
"The VLSI Implementation of a Reed-Solomon Encoder Using Berlekamp's Bit-Serial Multiplier Algorithm", I-S Hsu et al., *IEEE Transactions on Computers*, vol. 33, No. 10, pp. 906-911, Oct. 1984.
"A VLSI Design of a Pipeline Reed-Solomon Decoder", H. Shao et al., *IEEE Transactions on Computers*, vol. C-34, No. 5, pp. 393-402, May, 1985.
"On the VLSI Design of a Pipeline Reed-Solomon Decoder using Systolic Arrays", H. Shao et al., IEEE Transactions on Computers, vol. 37, No. 10, pp. 1273-1280, Oct. 1988.
"Efficient Dispersal of Information for Security, Load Balancing, and Fault Tolerance", M. O. Rabin, *Journal of the ACM*, vol. 36, No. 2, pp. 335-348, Apr. 1989.

*Primary Examiner*—Robert W. Beausoliel
*Attorney, Agent, or Firm*—Leonard Charles Suchyta

[57] ABSTRACT

In accordance with an inventive FEC code, data is transmitted in codewords comprising n m-bit symbols. Of the n symbols, k symbols are known information symbols and h symbols are parity symbols for erasure correction. All of the symbols of the codeword are elements of a field of $2^m$ integers which is closed with respect to addition and multiplication such as a Galois field. To determine the h parity symbols, an encoder circuit derives a matrix corresponding to a set of simultaneous equations in terms of the k known information symbols and the h parity symbols. This set of equations is then solved for the h parity symbols so that a codeword is transmitted comprising k known information symbols and h known parity symbols. At a decoder, the values of up to h erased symbols in the codeword may be reconstructed using a similar set of simultaneous equations.

14 Claims, 5 Drawing Sheets

FORWARD ERROR CORRECTION CODE SYSTEM

FIELD OF THE INVENTION

The present invention relates to a method and apparatus for a forward error correction code to correct erasures in data transmitted via a telecommunications channel. The invention is especially useful in a broadband tele- communications network where a dominant cause of data corruption is switch congestion.

BACKGROUND OF THE NETWORK

In a broadband telecommunications network, a transport protocol is used to transfer information end-to-end over a wide variety of channels, matching the requirements of various applications to the network capabilities. One important aspect of the transport protocol is the problem of error control. When the communications network provides an unacceptable error rate, the transport protocol must detect the errors and recover lost information. Ideally, the transport protocol provides a channel with acceptable reliability, without violating an application's requirements for throughput, delay or cost.

Several coding techniques are presently utilized to improve the reliability of a channel. In an Automatic Repeat request (ARQ) system, enough parity bits are transmitted to detect an error using an error detection code (see, e.g., P. G. Farrell, "Influence of LSI and VLSI Technology on the Design of Error Correction Coding Systems," Proc. IEE, Vol. 129, Pt.F, No. 5, October 1982). However, corrupted data must always be retransmitted since there is not enough information in the parity bits to correct the detected errors. The number of retransmissions depends on the channel error distribution so there is no guarantee that there will be an upper bound on the delay.

In a Forward Error Correction (FEC) code, enough extra parity bits are transmitted to enable a receiver to correct the maximum expected amount of corrupted data without any further retransmission. (See, e.g., R. J. McEliece, "The Theory of Information and Coding," Addison Wesley, 1977; I-S. Hsu, I. Reed, T. Truong, K. Wang, C-S Yeh and L. Deutch, "The VLSI Implementation of a Reed-Solomon Encoder Using Berlekamp's Bit-Serial Multiplier Algorithm," IEEE Transactions on Computers, Vol. 33, No. 10, pp. 906-911, October 1984; H. Shoa, T. Truong, L. Deutch, J. Yuen and I. Reed, "A VLSI Design of a Reed-Solomon Decoder," IEEE Transactions on Computers, Vol. 33, No. 10, pp. 906-911, October 1984; H. Shoa and I. Reed, "On the VLSI Design of a Reed-Solomon Decoder Using Systolic Arrays, " IEEE Transactions on Computers, Vol. 37, No. 10, pp. 1273-1280, October 1988). An FEC Code is used when a return channel is unavailable or too slow. Typically, an FEC code is utilized in satellite or deep space telecommunications.

There are also hybrid schemes which combine some features of both ARQ and FEC codes. In one hybrid scheme, the receiver uses the transmitted parity bits for error correction and error detection. The receiver corrects a certain number of errors using an error correction code (like FEC), but when there are two many errors, the receiver uses an error detection code to request retransmission (like ARQ). In an alternative hybrid scheme, the original message is generated just like in a pure ARQ scheme, with only enough extra bits transmitted to allow the receiver to perform error detection. However, when a retransmission is requested, the transmitter sends parity bits from an FEC code so that the receiver can reconstruct the lost data, rather than retransmitting the entire message.

In present day commercial telecommunications and computer systems, ARQ is used almost exclusively. In particular, because telephone channels have variable capacity, FEC is inefficient or unreliable. In addition, because of the complexity of available FEC algorithms, FEC is too slow or expensive.

However, ARQ correction codes are generally not suitable for use in broadband networks. More specifically, some real-time applications such as video transmissions require a guaranteed end-to-end delay; typically the response time of a human—say 50 ms to 500 ms. For a 5000 kilometer transcontinental link, with a one-way communication delay of approximately 25 ms to 50 ms, simple ARQ cannot be utilized because the number of retransmissions required will cause delays to be outside the acceptable range.

A further difficulty in using ARQ in broadband networks is that the hardware required for ARQ grows rapidly as the bandwidth increases.

An additional problem with ARQ in broadband networks relates to the multicasting application. In a multicasting application, data is transmitted from a source to a selected plurality of receivers. Because of the large number of receivers in a multicast system, ARQ degrades significantly. Latency is large even for low error rates because the number of retransmissions is determined by the number of receivers. Transmitter complexity is also proportional to the number of receivers as a block of transmitted data cannot be deleted from the transmitter until an acknowledgement (negative or positive) is received from the entire multicast group.

For broadband networks, FEC is more efficient than ARQ. FEC encoding and decoding delays can be kept small compared to the communications time. Specifically, FEC has a maximum latency of only a one-way communication. In addition, in contrast to ARQ, FEC always makes an attempt to decode and correct errors, thereby reducing the need to store and manage transmitted data at the source. Therefore in comparison to ARQ, FEC is preferable for wideband multicasting applications. In addition, FEC hardware may be less complex than ARQ hardware at high bit rates.

Presently available high performance, low latency FEC codes are computationally demanding. For example, the Reed-Solomon (RS) cyclic word error correction code has only recently been implemented on a single VLSI chip that can run at rates on the order of 100 megabits per second.

Other FEC codes (see, e.g., M. O. Rabin, "Efficient Dispersal of Information for Security, Load Balancing, and Fault Tolerance," Journal of the ACM, Vol. 36, No. 2, pp. 335-348, April 1989) suffer from various drawbacks, including that the original data is not transmitted in clear form and that the codes are computationally complex so that they are slow and also difficult to implement.

In view of the foregoing, it is an object of the present invention to provide an FEC code which is computationally simpler than existing FEC codes. It is a further object of the invention to provide a simplified version of an RS code suitable for use in a broadband network.

In a conventional telecommunications network, link error characteristics are strongly influenced by impulse noise (e.e., lightning near copper telephone wires) so that errors occur at random times and in bursts of random duration. In broadband networks, fiber optic transmission facilities are utilized so that this type of error does not predominate. Instead, in a broadband network, the predominant error results from congestion at the network switches. In a broadband network, data is organized into cells and routed from a source through a sequence of switches to a destination. If a switch cannot route or buffer a cell, the cell is lost. Thus, errors which occur in broadband networks are in the form of burst erasures of one or more cells. This property enables a substantial simplification of FEC codes used in broadband network because the data may be transmitted in such a way that the locations of the errors are known.

In coding theory, an error is defined as a corrupted bit or symbol with an unknown value in an unknown location An erasure is defined as corrupted bit or symbol with an unknown value but with a known location. As indicated above, losses due to switch congestion in a broadband network fall into the erasure category.

Accordingly, it is an additional object of the present invention to provide a very simple FEC code which can correct erasures in transmitted data. It is a still further object of the invention to provide an FEC code which can be utilized for erasure correction in a broadband network.

SUMMARY OF THE INVENTION

In accordance with the present invention data is transmitted from a transmitter to a receiver via a communications channel in the form of codewords comprising n m-bit symbols. Of the n symbols in a codeword to be transmitted, k are known information symbols and h are parity symbols used for erasure correction.

The symbols in a codeword are chosen from a closed field of $2^m$ integer elements. The field is closed with respect to the mathematical operations of addition and multiplication which means that combining two integers from the field using addition or multiplication yields another integer in the field. Illustratively, the field of integers is a Galois Field or alternatively, a field of integers which obeys modular arithmetic.

To determine the h parity symbols in an n symbol codeword to be transmitted, an encoder circuit located at the transmitter formulates a system of h simultaneous linear algebraic equations in terms of the k known information symbols and the h unknown parity symbols. The encoder then solves the equations for the h parity symbols so that an n symbol codeword comprising k information symbols and h parity symbols is transmitted from the encoder to a receiver.

At a receiver, the n symbol codeword is received. The coding technique of the present invention may be used to correct up to h symbole erasures in the received codeword utilizing the correctly received symbols. This is accomplished by a decoder circuit which forms a system of linear algebraic equations in terms of the correctly received symbols and the up to h symbol erasures and solves the equations to determine the values of the h erasures.

The same circuit may be used as an encoder and as a decoder. Illustratively, the circuit comprises a low complexity systolic chip architecture which utilizes only three basic cells. The circuit is capable of a throughput of over 1 gigabit/sec in 1μ CMOS. In contrast, the conventional Reed-Solomon code utilizes much more complex coding circuitry which requires a much larger number of cells.

The inventive FEC code is highly adaptive. If $n<2^m$, then h and n can be varied almost arbitrarily. Increasing the block size (i.e. the codeword size n) requires no extra hardware in the encoder or decoder. However, the size of the required hardware increases quadratically with h.

The inventive FEC code operates very efficiently at a low redundancy. Redundancy is the ratio of parity symbols to information symbols. Since fiber optic broadband networks exhibit only small amounts of errors, the inventive code is highly suitable for this application.

In short, the present invention is a very simple FEC code which has a very simple hardware implementation and is particularly useful in broadband networks.

The basis of the coding scheme of the present invention can be understood from the following example which utilizes modular arithmetic This example utilizes codewords of n=7 symbols with k=4 known information symbols and h=3 parity symbols. Thus, a codeword to be transmitted has the form $$C=(a,b,c,d,e,f,g) \qquad (1)$$

with a,b,c, being the parity symbols and d,e,f,g being the known information symbols. The symbols a,b,c,d,e,f and g are chosen from the field of eight integers (i.e. 0,1,2,3,4,5,6,7) which obey mod 7 arithmetic.

Consider the following set of three simultaneous equations with seven integer variables (a–g) in the mod 7 arithmetic system:

$$\begin{aligned} a + c + e + g &= 0 \mod 7 \\ b + c + f + g &= 0 \mod 7 \\ d + e + f + g &= 0 \mod 7 \end{aligned} \qquad (2)$$

These equations are chosen so that if four of the symbols a,b,c,d,e,f,g, are known, there is unique solution for the three remaining symbols. The equations may be used by an encoder circuit to determine the parity symbols of a codeword from the known information symbols. If the k known information symbols are d=4, e=3, f=2 and g=5, then the system of equations above may be solved at the encoder circuit to obtain a=6, b=0, c=0. Therefore, the codeword that is sent is $$C32\ (6,0,0,4,3,2,5) \qquad (3)$$

Now, assume that in transmission, h=3 erasures occur so that the codeword that is received at the decoder is $$C=(a,0,0,d,3,2,g) \qquad (4)$$

The system of equations (2) may be utilized by a decoder circuit to reconstruct the full codeword C as follows $$\begin{aligned} c + 3 + g &= 0 \mod 7 \\ 2 + g &= 0 \mod 7 \\ d + 3 + 2 + g &= 0 \mod 7 \end{aligned} \qquad (5)$$

The decoder circuit solves these equations to obtain a=6, d=4, g=5, thereby reconstructing the entire codeword exactly as it was transmitted.

DETAILED DESCRIPTION OF THE INVENTION

The detailed description of the invention is divided into the following subsections. Subsection A provides a general mathematical description of the FEC coding technique of the present invention. Subsection B provides an illustrative example of the FEC coding technique of the present invention. Subsection C describes an encoder/decoder circuit which may be utilized to implement the FEC coding technique of the present invention. Subsection D shows how the coding technique of the present invention may be utilized in a broadband network.

A. Mathematical Description of the Code

Figure 1:
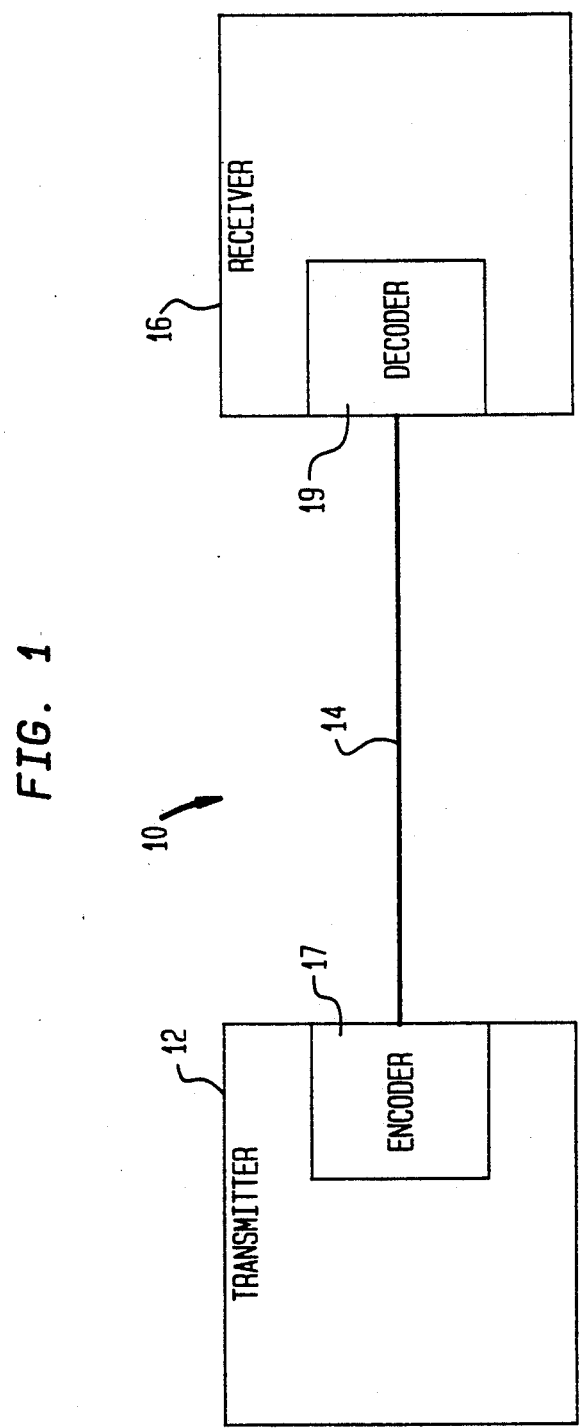
FIG. 1 schematically illustrates a communications channel which utilizes an FEC code in accordance with an illustrative embodiment of the present invention.

FIG. 1 schematically illustrates a telecommunications channel 10. The channel includes a transmitter 12, a communications medium 14 such as an optical fiber cable, and a receiver 16. The transmitter 12 includes an encoder 17 which encodes data to be transmitted utilizing an FEC code. Data is transmitted from the transmitter to the receiver in the form of blocks or codewords. Each codeword contains both information symbols and parity symbols. The encoder 17 utilizes the information symbols of each codeword to construct the parity symbols. When the receiver 16 receives the encoded codeword, the decoder 19 utilizes correctly received information and parity symbols to correct erasures in the transmitted codeword. The code used at the encoder to determine the parity symbols and used at the decoder to correct erasures is explained in detail below.

Consider a codeword C which is made up of n m-bit symbols:

$$C = (c_{n-1}, c_{n-2}, \ldots, c_0) \quad (6)$$

All of the symbols which can be used in a codeword are chosen from a field of integers such as the Galois Field $GF(2^m)$. A Galois field is a field or set of integers which obey certain arithmetic rules. In particular, the Galois field is closed with respect to certain operations such as addition and multiplication, so that when two field elements are combined using one of these operations, a third field element results. The codeword can be represented mathematically by a polynomial of degree n, with the coefficients of the polynomial being formed using the symbols of the codeword.

$$C(X) = c_{n-1}X^{n-1} + c_{n-2}X^{n-2} + \ldots + c_0 \quad (7)$$

It is desired to transmit k information symbols (k*m bits) and to transmit h parity symbols (h*m bits). The total number of symbols to be sent in a codeword is:

$$n = h + k \quad (8)$$

For a valid codeword:

$$n < 2^m \quad (9)$$

The inventive code can correct up to e erasures and detect d additional errors provided:

$$h \leq d + e \quad (10)$$

A codeword C(x) is constructed to be a polynomial of degree n which can be divided by a generator polynomial g(x) of degree h, using the construction rule:

$$g(x) = (x - a^1)(x - a^2) \ldots (x - a^h) \quad (11)$$

where each of the $a^j$ is one of the $2^m$ elements of $GF(2^m)$.

The information I to be transmitted is made up of k m-bit symbols:

$$i = (i_{k-1}, i_{k-2}, \ldots, i_0) \quad (12)$$

This can be represented by a polynomial of degree k:

$$i(x) = i_{k-1}x^{k-1} + i_{k-2}x^{k-2} + \ldots + i_0 \quad (13)$$

If the least significant k symbols of the codeword are set equal to the k information symbols, then:

$$\begin{aligned}C(x) = &c_{n-1}x^{n-1} + c_{n-2}x^{n-2} + \ldots \\&+ c_k x^k + i_{k-1}x^{k-1} + i_{k-2}x^{k-2} + \ldots + i_0\end{aligned} \quad (14)$$

The remaining h symbols on $c_{n-1}, c_{n-2}, \ldots c_k$ (i.e., the parities of the codeword) are chosen to ensure g(x) divides C(x). From equation 11 it is known that:

$$C(x) = 0 \text{ for } x = a^1, x = a^2, \ldots, x = a^h \quad (15)$$

Therefore, in order to ensure g(x) divides C(x), the following h equations must hold true:

$$\begin{aligned}0 = &c_{n-1}a^{1(n-1)} + c_{n-2}a^{1(n-2)} \ldots + c_k a^{1k} + \\&l_{k-1}a^{1(k-1)} + l_{k-2}a^{1(k-2)} \ldots + l_0 a^{1(0)}\end{aligned} \quad (16)$$

$$0 = c_{n-1}a^{2(n-1)} + c_{n-2}a^{2(n-2)} \ldots + c_k a^{2k} +$$
$$l_{k-1}a^{2(k-1)} + l_{k-2}a^{2(k-2)} \ldots + l_0 a^{2(0)}$$

$$\ldots$$

$$0 = c_{n-1}a^{h(n-1)} + c_{n-2}a^{h(n-2)} \ldots + c_k a^{hk} +$$
$$l_{k-1}a^{h(k-1)} + l_{k-2}a^{h(k-2)} \ldots + l_0 a^{h(0)}$$

This is set of h simultaneous linear algebra equations in the Galois field arithmetic system, with n terms and h unknowns. The equations can be uniquely solved for the h unknown symbols ($c_{n-1}, c_{n-2}, \ldots c_k$). When these heretofore unknown parity symbols are determined, the entire codeword may then be transmitted to a remote receiver.

One method of solving simultaneous equations is by matrix manipulation. Here, the above h simultaneous equations are represented by a matrix (h-matrix) shown below.

$$[ \ a^{1(n-1)} \ a^{1(n-2)} \ a^{1k} \ x_1 \ ] \tag{17}$$
$$[ \ a^{2(n-1)} \ a^{2(n-2)} \ a^{2k} \ x_2 \ ]$$
$$[ \ \ldots \ ]$$
$$[ \ a^{h(n-1)} \ a^{h(n-2)} \ a^{hk} \ x_h \ ]$$

where $x_j = l_{k-1}a^{j(k-1)} + l_{k-2}a^{j(k-2)} + \ldots + l_0 a^{j(0)}$

If the resulting codeword is transmitted and (up to) h of the symbols are lost, it is possible to fill in missing symbols if the locations are known. If the unknown symbols are represented by a variable, then (up to) h simultaneous equations ca be constructed and solved, just as at the encoder. Thus, the encoding and decoding algorithms are identical, except that in the decoding case, the unknowns are in different positions in the codeword. Therefore, provided there are fewer than h erasures, all erasures can be reconstructed.

B. Illustrative Example

Let h=3, k=4, n=7 and m=4 (which obey equations (8) and (9)). This is a 7 symbol block code, with 3 bits per symbol. It can correct up to 3 missing symbols per block and carry four symbols of user information. The information will occupy the right 4 symbols and the parities the left 3 symbols.

As indicated above, all of the symbols which can be used to form a codeword are chosen from the integers in a particular field.

For the present example, let the field elements be defined using $a^3=a+1$ as the basis (see, e.g., R. J. McEliece, "The Theory of Information and Coding," Addison Wesley, 1977). Thus the eight elements of the field are:

$$a^0 = 001 \quad a^1 = 010 \quad a^2 = 100 \quad a^3 = 011 \tag{18}$$
$$a^4 = 110 \quad a^5 = 111 \quad a^6 = 101 \quad a^7 = 000$$

A field element (symbol) can be represented using either its binary representation or by the powers of a field element a. Using the "powers representation" (where $a^j$ is represented by the power, j), addition and multiplication in the field are defined by tables 19 and 20, respectively. (Note that the zero element, 7, is not a power of the primitive element; but it is treated as if it were.)

TABLE 2

ADDITION TABLE

| + | 0 | 1 | 2 | 3 | 4 | 5 | 6 | 7 | (19) |
|---|---|---|---|---|---|---|---|---|---|
| 0 | 7 | 3 | 6 | 1 | 5 | 4 | 2 | 0 | |
| 1 | 3 | 7 | 4 | 0 | 2 | 6 | 5 | 1 | |
| 2 | 6 | 4 | 7 | 5 | 1 | 3 | 0 | 2 | |
| 3 | 1 | 0 | 5 | 7 | 6 | 2 | 4 | 3 | |
| 4 | 5 | 2 | 1 | 6 | 7 | 0 | 3 | 4 | |
| 5 | 4 | 6 | 3 | 2 | 0 | 7 | 1 | 5 | |
| 6 | 2 | 5 | 0 | 4 | 3 | 1 | 7 | 6 | |
| 7 | 0 | 1 | 2 | 3 | 4 | 5 | 6 | 7 | |

TABLE 3

MULTIPLICATION TABLE

| * | 0 | 1 | 2 | 3 | 4 | 5 | 6 | 7 | (20) |
|---|---|---|---|---|---|---|---|---|---|
| 0 | 0 | 1 | 2 | 3 | 4 | 5 | 6 | 7 | |
| 1 | 1 | 2 | 3 | 4 | 5 | 6 | 0 | 7 | |
| 2 | 2 | 3 | 4 | 5 | 6 | 0 | 1 | 7 | |
| 3 | 3 | 4 | 5 | 6 | 0 | 1 | 2 | 7 | |
| 4 | 4 | 5 | 6 | 0 | 1 | 2 | 3 | 7 | |
| 5 | 5 | 6 | 0 | 1 | 2 | 3 | 4 | 7 | |
| 6 | 6 | 0 | 1 | 2 | 3 | 4 | 5 | 7 | |
| 7 | 7 | 7 | 7 | 7 | 7 | 7 | 7 | 7 | |

Let the transmitter (see FIG. 1) have some information (I) it wishes to transmit, where:

$$I=(6,5,7,1) \tag{21}$$

Let the unknown code symbols $c_{n-1}=t$, $c_{n-2}=s$ and $c_{n-h}=r$. The generator polynomial is defined by:

$$g(x)=(x-1)*(x-2)*(x-3) \tag{22}$$

From equation 15:

$$C(x)=0 \text{ for } x=1, x=2 \text{ and } x=3 \tag{23}$$

From the set of equations (16) the following set of equations may be derived for the unknown parity symbols, t, s, r:

$$0 = t.(6^1) + s.(5^1) + r.(4^1) + 6.(3^1) + 5.(2^1) + 7.(1^1) + 1.(0^1) \tag{24}$$
$$0 = t.(6^2) + s.(5^2) + r.(4^2) + 6.(3^2) + 5.(2^2) + 7.(1^2) + 1.(0^2)$$
$$0 = t.(6^3) + s.(5^3) + r.(4^3) + 6.(3^3) + 5.(2^3) + 7.(1^3) + 1.(0^3)$$

Therefore, $$0 = t.(6) + s.(5) + r.(4) + 6.(3) + 5.(2) + 7.(1) + 1.(0) \tag{25}$$
$$0 = t.(5) + s.(3) + r.(1) + 6.(6) + 5.(4) + 7.(2) + 1.(0)$$
$$0 = t.(4) + s.(1) + r.(5) + 6.(2) + 5.(6) + 7.(3) + 1.(0)$$

The three unknown parity symbols are found by applying matrix manipulation techniques to the following matrix.

$$[6 \ 5 \ 4 \ (2 + 0 + 7 + 1)] \tag{26}$$
$$[5 \ 3 \ 1 \ (5 + 2 + 7 + 1)]$$
$$[4 \ 1 \ 5 \ (1 + 4 + 7 + 1)]$$

The unique solution for these 3 simultaneous equations is: t=1, s=6 and r=7. So the codeword is:

$$C=(1,6,7,6,5,7,1) \tag{27}$$

This codeword is then transmitted to a receiver which includes a decoder (see FIG. 1). The decoder can correct up to 3 erasures in any of the 7 symbols. Let there be 3 erasures represented by "f":

$$C^*=(1,6,7,f,5,f,f) \tag{28}$$

The receiver can generate three simultaneous equations in three unknowns. If $c^*_3=w$, $c^*_1=v$ and $c^*_0=u$, then:

$$0 = 1.(6) + 6.(5) + 7.(4) + w.(3) + 5.(2) + v.(1) + u.(0) \tag{29}$$
$$0 = 1.(5) + 6.(3) + 7.(1) + w.(6) + 5.(4) + v.(2) + u.(0)$$
$$0 = 1.(4) + 6.(1) + 7.(5) + w.(2) + 5.(6) + v.(3) + u.(0)$$

The three unknown symbols can be found by applying matrix manipulation techniques to the following matrix.

$$[3\ 1\ 0\ (0 + 4 + 7 + 0)] \quad (30)$$
$$[6\ 2\ 0\ (6 + 2 + 7 + 2)]$$
$$[2\ 3\ 0\ (5 + 0 + 7 + 4)]$$

The unique solution is: $w=6$, $v=7$ and $u=1$. So the rebuilt codeword is:

$$C = (1,6,7,6,5,7,1) \quad (31)$$

exactly as sent.

Hardware Implementation of the FEC Coder/Decoder

The architectures for the encoder 17 and decoder 19 of FIG. 1 are identical. In both cases an n symbol codeword C is constructed (or reconstructed), with (up to) h of the symbols being unknown.

Figure 2:
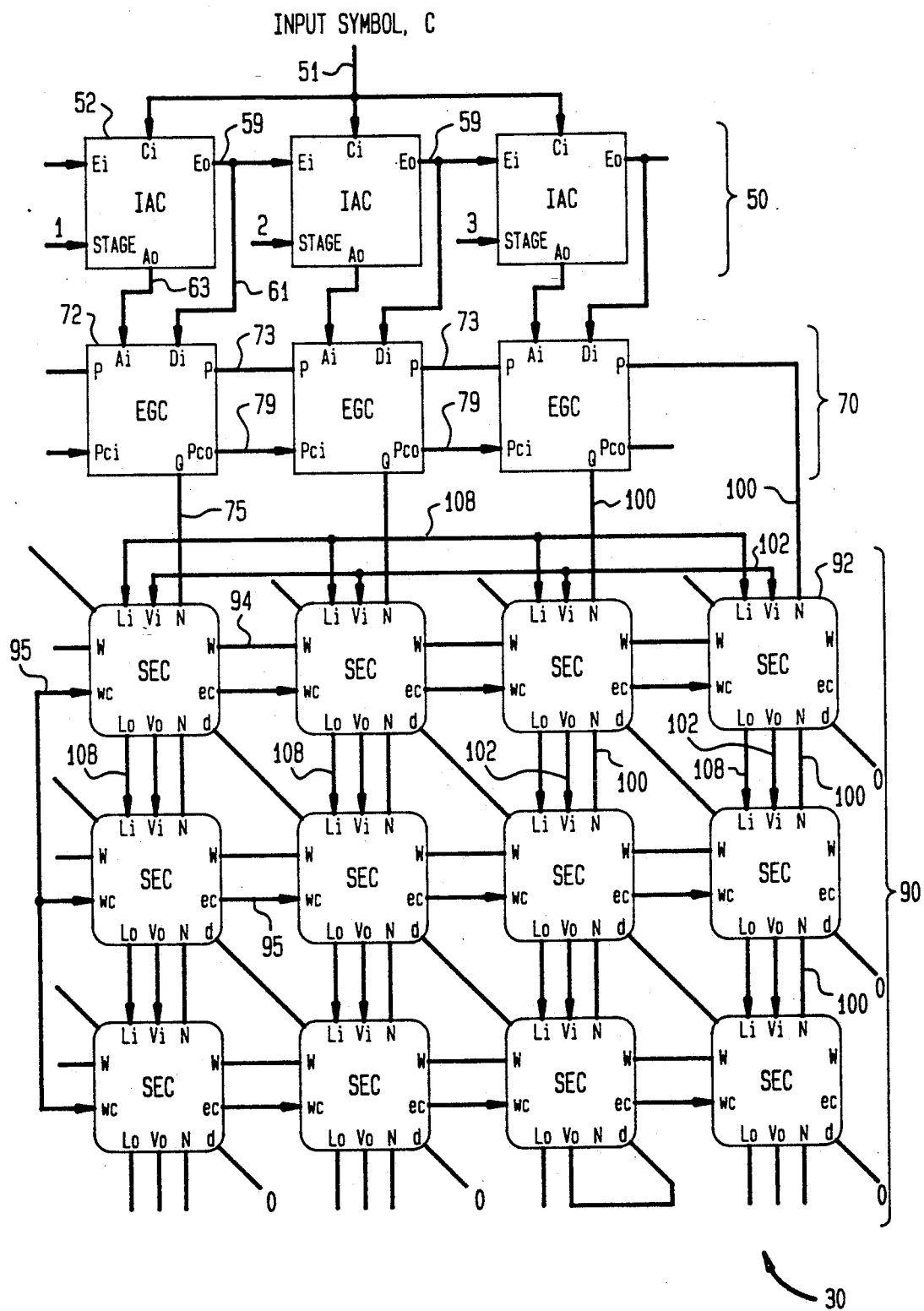
FIG. 2 schematically illustrates an encoder/decoder circuit in the form of an array of cells for implementing the FEC code of the present invention.

An encoder/decoder circuit architecture is shown in FIG. 2. The encoder/decoder circuit 30 is split into three functional sections. The Input Accumulation Section (IAS) 50 is formed from the cells 52 and accepts the n input symbols of a codeword sequentially Via the lines 51, least significant symbol first. Unknown symbols are marked with an extra bit. The IAS 50 passes unknown symbol position markers and appropriately weighted accumulations of the known input symbols to the Equation Generation Section (EGS) 70. The EGS 70 is formed from the cells 72 and outputs an h-matrix, one row at a time, to the Simultaneous Equation Section (SES) 90. The SES 90 is formed from the cells 92 and finds the values of the unknown variables by solving the h-matrix.

In the description of the IAS 50, EGS 70 and SES 90, an n symbol codeword, $$C = (c_{n-1}, c_{n-2}, \ldots, c_0), \quad (32)$$

with h missing symbols in positions, $$(c_H, c_G, \ldots, c_A), \quad (33)$$

is employed. Illustratively, all symbols used in the codeword C are integers in the field $GF(2^3)$.

Figure 3:
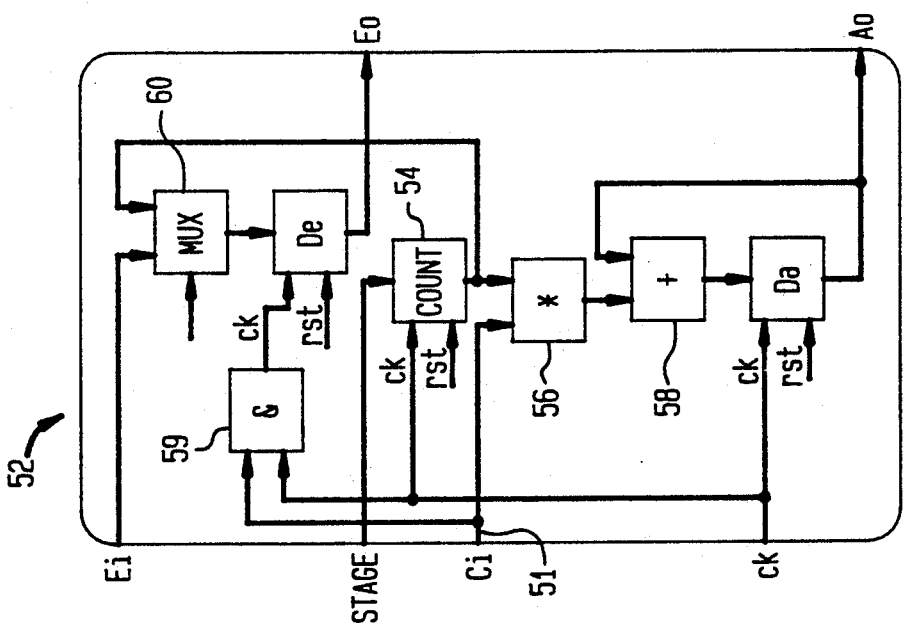

A block diagram of an Input Accumulation Cell IAC 52 from the IAS 50 of FIG. 2 is shown in FIG. 3. The Input Accumulation Cell 52 is designed to be replicated in a linear systolic array, whose length is equal to the number of symbols that require correction (h). For example, if three erasures must be corrected (h=3), three IACs must be tied together in a chain, as shown in the top row of FIG. 2.

Consider first the simplest case where h=1, so the IAS 50 requires only one IAC 52. As shown in FIG. 3, the cell 52 comprises an accumulation register Da, an erasure register De, and a counter 54. The cell 52 also has an input ok for a clock signal. Initially, the registers Da and De are reset to zero (e.g., $a^7 = 000$). Also the counter 54 is reset to a field element (e.g. $a^1 = 010$).

During the first clock cycle, the first symbol ($c_0$) of the codeword to be encoded or decoded is loaded into the cell (via the pins $C_i$). The pins $C_i$ contain the m bits of the symbol ($C_{i_{m-1}} - C_{i_0}$) together with an extra bit ($C_{i_m}$) which, if set, means that the inputted symbol is unknown (i.e. a parity symbol or erasure to be determined). For this example assume that $c_0$ is known, so $C_{i_m}$ is reset. The value on Ci is multiplied by the initial contents of the counter 54 (e.g. $a^1$). The multiplication is accomplished by the Galois Field multiplier 56. The product ($c_0 * a^1$) is added using the Galois Field adder 58 to the current contents of the accumulation register Da and the result is stored in Da. Let the initial contents of Da (at time $t=-1$) be $Da(O)_{-1}$ (where $Da(O)$ indicates the accumulation register of the j=0 IAC in a chain of IAC's wherein $0 \leq j \leq h-1$) and the contents after the first clock cycle (at time $t=0$) be $Da(O)_0$. Then, $$\begin{aligned} Da(0)_0 &= Da(0)_{-1} + (c_0 * a^1) \\ &= a^7 + (c_0 * a^1) \\ &= (c_0 * a^1) \end{aligned} \quad (34)$$

The counter 54 sequentially steps through all the non-zero (e.g. not $a^7$) elements of the field. It starts with a particular element (e.g. $a^1$) and goes up in steps determined by the value on the stage pins. For the j=0 IAC, the counter 54 will go through the field elements in order: that is, $$a^1, a^2, a^3, a^4, \ldots \quad (35)$$

Therefore, during the second clock cycle (at time $t=1$), the contents of the counter 54 will be $a^2$. This is multiplied with the next symbol $c_1$ and the product ($c_1 * a^2$) is added to the contents of Da:

$$\begin{aligned} Da(0)_1 &= Da(0)_0 + (c_1 * a^2) \\ &= (c_0 * a^1) + (c_1 * a^2) \end{aligned} \quad (36)$$

In general, at time $t=j$:

$$Da(O)_j = Da(O)_{j-1} + (c_j * a^{j+1}) \quad (37)$$

This process is repeated until either there are no more symbols (at time $t=n-1$) or a symbol is labeled as unknown (i.e. $C_m$ is set). If symbol $c_A$ (where $0 \leq A < n$) is labeled as unknown, then at time A, the current content of the counter ($a^{A+1}$) is loaded into the erasure register De via the multiplexer 60. The register De is enabled for loading via the AND-gate 59 when both the clock and $C_m$ are high. Therefore, the value of the erasure register De at time A is:

$$De(O)_A = a^{A+1} \quad (38)$$

The contents of Da will be unaffected, because the input symbol is internally forced to appear to be the zero (e.g. $a^7$) when $c_m$ is set:

$$\begin{aligned} Da(0)_A &= Da(0)_{A-1} + (a^7 * a^{A+1}) \\ &= Da(0)_{A-1} + a^7 \\ &= Da(0)_{A-1} \end{aligned} \quad (39)$$

If only the A'th symbol ($c_A$) is an erasure, then after the n symbols of a codeword have been received, the contents of the erasure and accumulation registers will be:

$$De(0)_{n-1} = a^{A+1} \quad (40)$$

-continued $$Da(0)_{n-1} = \{(c_{n-1}*a^n) + (c_{n-2}*a^{n-1}) + \ldots + (c_0*a^1)\} - \{(c_A*a^{A+1})\}$$

The value stored in Da is available at the output Ao and value stored in De is available at the output Eo in FIG. 3.

If C was a valid codeword, then:

$$0 = c_{n-1}a^{1(n-1)} + C_{n-2}a^{1(n-2)} + \ldots c_0a^{1(0)} \quad (41)$$

Therefore, $$0 = Da(0)_{n-1} + c_A*De(0)_{n-1} \quad (42)$$

This is an equation with two knowns (Da and De) and one unknown ($c_A$).

More generally there will be h erasures and hence h IACs 52 tied together in a chain (see FIG. 2). Each IAC 52 receives the same input symbol via line 51 and the input pins Ci at the same time. However, the counter in each IAC steps through the elements of the field in a different sequence (i.e. the cells 52 have different inputs on the stage pins). In general for the j'th IAC the counter sequence is $a^j$, $a^{2j}$, $a^{3j}$, ...

The second major difference between the j'th IAC and 0'th IAC is what happens when there is an erasure. Only the j=0 cell loads De with the contents of its counter. All the other cells load their De with the contents of the De of the cell to their left in the chain via the output Eo of the cell to the left, the connecting lines 59 (see FIG. 2) and the input Ei. The multiplexer 60 determines in a particular IAC 52 whether De is loaded with the contents of the counter 54 or via the input Ei.

The values of the erasure and accumulation registers De and Da for the f'th stage at time $t = n-1$ will be:

$$De(f)_{n-1} = a^{G+1}$$

$$Da(f)_{n-1} = \{(c_{n-1}*a^{(f+1)(n-1)}) + (c_{n-2}*a^{(f+1)(n-2)}) + \ldots + (c_0*a^{(f+1)(0)})\} - \{(c_H*a^{H+1}) + (c_G*a^{G+1}) + \ldots + (c_A*a^{A+1})\}$$

If C was a valid codeword, then:

$$0 = c_{n-1}a^{1(n-1)} + c_{n-2}a^{1(n-2)} + \ldots + c_0a^{1(o)} \quad (44)$$
$$0 = c_{n-1}a^{2(n-1)} + c_{n-2}a^{2(n-2)} + \ldots + c_0a^{2(o)}$$
$$\ldots$$
$$0 = c_{n-1}a^{h(n-1)} + c_{n-2}a^{h(n-2)} + \ldots + c_0a^{h(o)}$$

Therefore, $$0 = c_H*(De(h-1)_{n-1})^1 + c_G*(De(h-2)_{n-1})^1 + \ldots + c_A*(De(0)_{n-1})^1 + Da(0)_{n-1} \quad (45)$$

$$0 = c_H*(De(h-1)_{n-1})^2 + c_G*(De(h-2)_{n-1})^2 + \ldots +$$

-continued $$c_A*(De(0)_{n-1})^2 + Da(1)_{n-1}$$
$$\ldots$$
$$0 = c_H*(De(h-1)_{n-1})^{h-1} + c_G*(De(h-2)_{n-1})^{h-1} + \ldots + c_A*(De(0)_{n-1})^{h-1} + Da(1h-1)_{n-1}$$

This is a reduced form of equations (16), with 2h knowns (Da's and De's) and h unknowns ($c_H$, $c_G$, ..., $c_A$). The above equations can be represented by the following h-matrix:

$$\begin{bmatrix} (De(0)_{n-1})^1 & (De(h-2)_{n-1})^1 & (De(h-1)_{n-1})^1 & Da(0)_{n-1} \\ (De(0)_{n-1})^2 & (De(h-2)_{n-1})^2 & (De(h-1)_{n-1})^2 & Da(1)_{n-1} \\ \ldots & & & \\ (De(0)_{n-1})^{h-1} & (De(h-2)_{n-1})^{h-1} & (De(h-1)_{n-1})^{h-1} & Da(h-1)_{n-1} \end{bmatrix} \quad (46)$$

The h-matrix is the starting is the starting point for SES 70. However, before the SES 90 (see FIG. 2) can start, the required powers of $De(j)_{n-1}$ are generated by the EGS 70 (see FIG. 2).

As shown in FIG. 2, the Equation Generation Section (EGS) 70 is a linear array of h Equation Generation Cells (EGSs) 72 operating in parallel with the IAS 50 and SES 90. The cells 72 are connected in a chain by the P bus 73 and the control lines 79. The control lines 79 connect the pco output of one cell 72 to the pci input of the next cell 72 Each EGC 72 receives the final values of the De and Da registers from the corresponding cell 52 of the IAS, leaving the IAS free to receive the next codeword. In particular, as shown in FIG. 2 each cell 72 receives from the cell 52 of the IAS right above it the final value of the De register via output Eo of the cell 52, line 61, and the input Di of the cell 72, and the final value of the Da register via the output Ao of the cell 52, line 63 and the input Ai of the cell 72.

Figure 4:
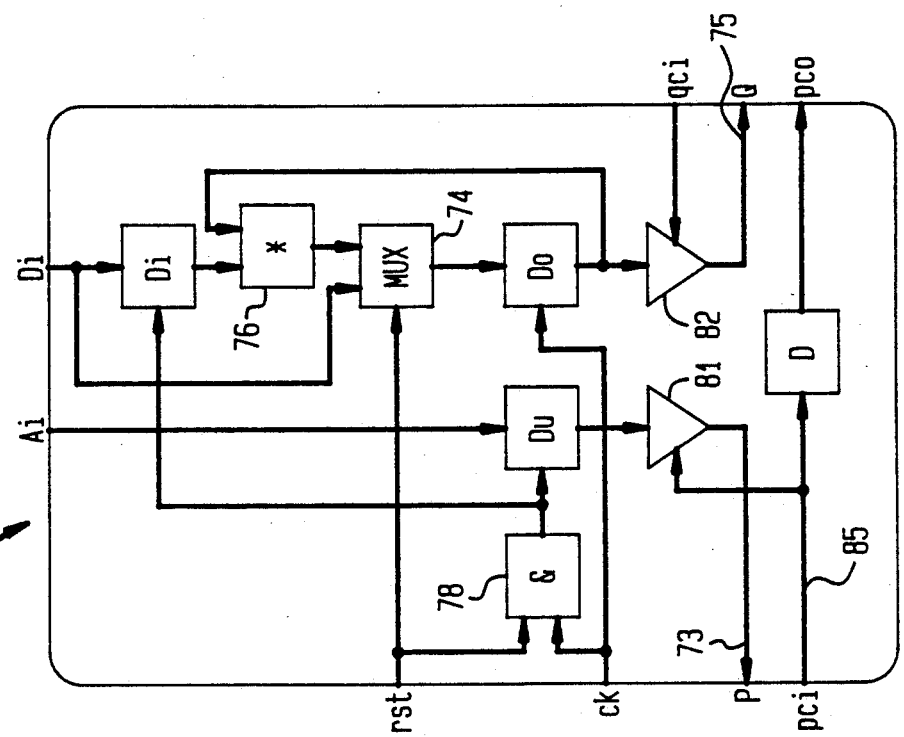
FIGS. 3, 4, and 5 illustrate cells which are utilized in the encoder/decoder circuit of FIG. 2.

The EGC cell 72 is illustrated in FIG. 4. The cell 72 comprises the registers Di, Do, and Da, the multiplexer 74, the Galois Field multiplier 76, the AND-gate 78 and the tristate devices 81 and 82. The final value of Da in corresponding cell 52 is stored in the Du register (via the Ai pins). The final value of De is stored in both the Di and Do registers (via the Di pins and the multiplexer 74). The Di and Du registers are activated for loading by a signal from the AND-gate 78 when the reset (rst) and clock (ck) pins are both high. From the values stored in the Di, Do, and Du registers, the cells 72 compute the h reduced simultaneous equations needed by the SAS.

The EGCs 72 take turns to output the values in their Du registers. The leftmost EGC will output:

$$Da(0)_{n-1} \quad (47)$$

onto the P bus 73 (see FIG. 2) in the first clock cycle. In general the j'th EGC outputs:

$$Da(j)_{n-1} \quad (48)$$

onto the P bus via the tristate device 81 in the j'th clock cycle. In particular, the tristate device 81 is opened to read the content of the Du register onto the P bus when pci is high. Note that in the cell 72, the pci input and the pco output are separated by a latch D. The latch D in all the cells 72 form a shift register so that a pci high signal reaches each cell 72 in the chain in succeeding clock cycles.

Each EGC also outputs the Do register onto the Q bus 75 (see FIG. 2). Thus the j'th EGC will output:

$$(De(j)_{n-1})^1 \tag{49}$$

onto the Q bus 75 via the tristate device 82 during the first clock cycle. The Q bus operates under the control of the qci pin. In general the j'th EGC outputs:

$$(De(j)_{n-1})^k \tag{50}$$

onto the Q bus 75 in the k'th clock cycle. These quantities are calculated as follows. During the first clock cycle, $Da(j)_{n-1}$ is loaded into Di and Do In succeeding clock cycles the contents of Do and Di are multiplied using the Galois Field multiplier 76 and the resulting product is loaded into Do via the multiplexer 74 to form the desired powers of $De(j)_{n-1}$, which quantities are transmitted to corresponding cells 92 in the SES 90 via the Q bus.

Figure 5:
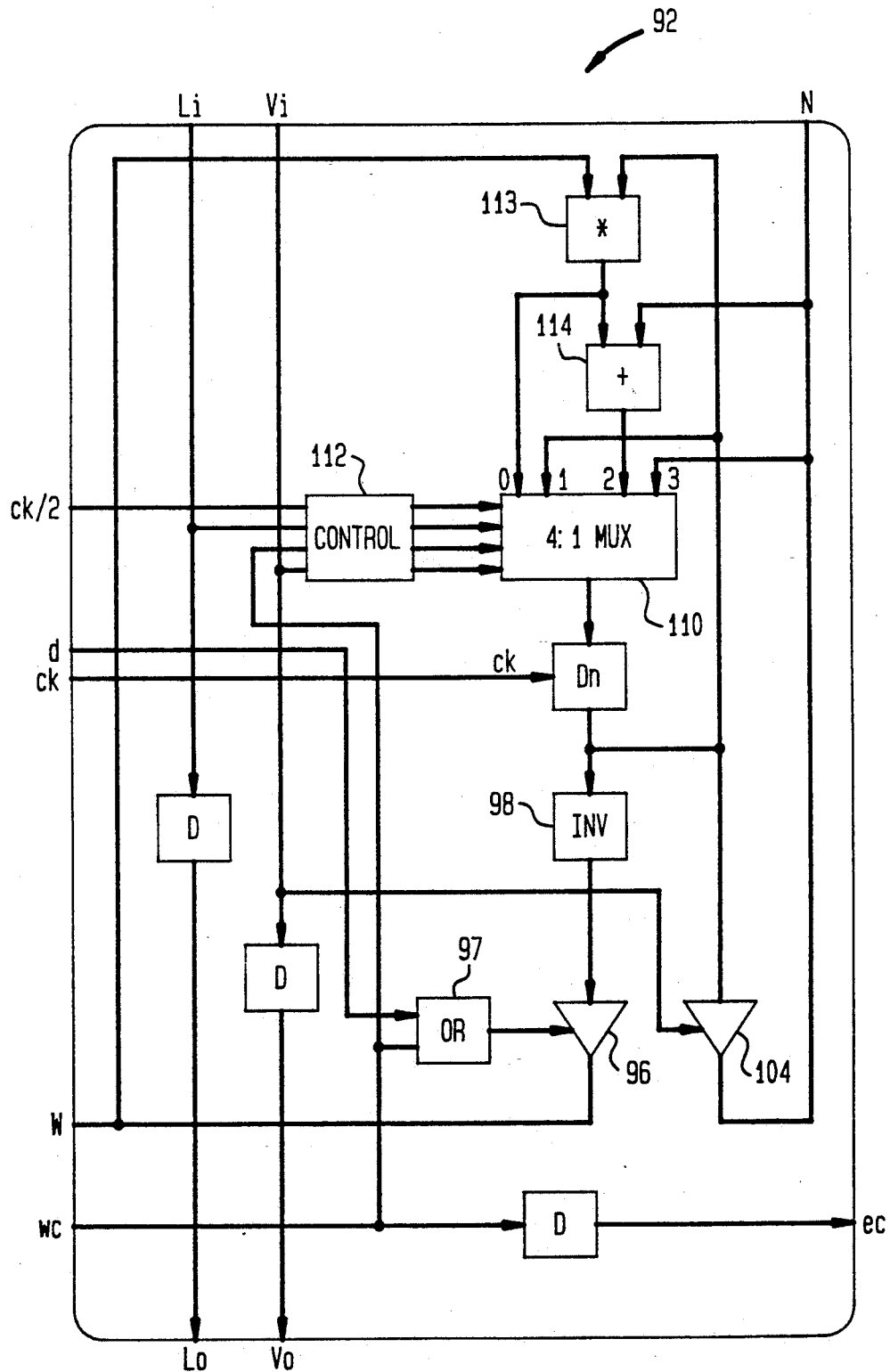

The Simultaneous Equation Section (SES) 90 is now considered in more detail. As shown in FIG. 2, the SES 90 comprises a two dimensional array of cells 92 organized in h rows and (h+1) columns. Each cell 92 from the SES is called a Simultaneous Equation Cell (SEC). A block diagram of an SEC 92 is shown in FIG. 5. Each SEC stores an element from the h-matrix of equation (46) in a register labeled Dn.

As shown in FIG. 2, the cells 92 are connected horizontally by the W bus 94. The W bus 94 is controlled by the control lines 95 which enter each cell at a wc input and leave each cell at an ec output. As shown in FIG. 5, within each cell 92 between the wc input and the eo output is a latch D. When the signal on wc is high, the tristate device 96 is opened via OR-gate 97 and contents of the Dn register are inverted by the inverter 98 and outputed onto the W bus.

As shown in FIG. 2, the cells 92 are connected vertically by the N bus 100. The N bus 100 is controlled by the control lines 102. As shown in FIG. 2, a control line 102 enters each cell 92 at a Vi input and leaves each cell 92 at a Vo output. As shown in FIG. 5, within each cell 92, a latch D separates the Vi and Vo outputs. When the Vi input is high, the tristate device 104 is opened and the contents of the register Dn are written onto the N bus. Thus, the contents of the cell Dn are read out via the W and N buses under the control of the wc and Vi inputs.

Still another read operation for the register Dn involves the input d. In FIG. 2, when the rightmost column of cells 92 is not considered, the remaining cells 92 form an hxh array. For all cells not on the diagonal of this array, the d input is always low. For cells on the diagonal, when d is high, the tristate device 96 is opened via the OR-gate 97 and the contents of Dn for the cells on the diagonal are read out onto the W bus.

Information is written into the register Dn of the cell 92 of FIG. 5 via the multiplexer 110. The multiplexer 110 has four inputs labeled 0,1,2,3. The signal on a selected one of the inputs is transmitted to the output of the multiplexer 110 depending on a signal provided by the control 112. The signal at the input 3 is the signal present on the N bus. This signal is loaded into the register Dn when the Li input to the cell is high. As shown in FIG. 2, the cells 92 are connected vertically by the control lines 108. A control line 108 extends from the Lo output of one cell to the Li input of the vertically adjacent cell. As shown in FIG. 5, within each cell, the Li input is connected to the Lo output via a latch D.

The signal at the input 0 of the multiplexer is obtained from the output of the Galois Field multiplier 112. The multiplier 112 multiplies the current value stored in Du with the value on the W bus. This product is stored in the register Dn via the multiplexer 110 when ck/2 is low and wc is high. The signal ck2 is at one-half of the clock signal ck The signal at the input 1 of the multiplexer is the current value of Dn, this value is rewritten into Dn when ck2 is high and Vi is high.

The signal at the input 2 of the multiplexer 110 is from the output of the Galois Field adder 114. The adder 114 adds the current value on the N bus and the output of the multiplier 112. This value is written into Dn when ck2 is high and Vi is low.

The read and write operations described above for the cell 92 may be used to solve the h matrix of equation (46). Let the contents of the Dn register of each SEC 92 be represented by the variable 'S' followed by a row index (going from 0 to h−1) and column index (going from 0 to h) enclosed in square brackets. The h-matrix can then be represented by:

$$
\begin{matrix}
[ & s[0,0] & s[0,1] & \ldots & s[0,h-1] & s[0,h] & ] \\
[ & s[1,0] & s[1,1] & \ldots & s[1,h-1] & s[1,h] & ] \\
[ & \ldots & & & & & ] \\
[ & s[h-1,0] & s[h-1,1] & \ldots & s[h-1,h-1] & s[h-1,h] & ]
\end{matrix}
\tag{51}
$$

The righthand column stores the values from the P bus. For example, the j+1'th cell in the righthand column stores the value, $$s[j,h] = (Da(j)_{n-1}) \tag{52}$$

in its Dn register.

The remaining calls (forming an h by h matrix) store the values from the Q bus. For example, the j+1'th cell in the k+1'th column stores in its Dn register:

$$s[j,k] = (De(k)_{n-1})^j \tag{53}$$

The array thus contains all the terms from the h-matrix.

Having stored the h-matrix, the SES is ready to solve the unknowns. The operation takes a total of (h+1) clock cycles with a multiplication and addition each cycle.

During the first clock cycle, after storing the h-matrix, the cells in the first SES column calculate the inverse of their Dn register; placing the result onto the corresponding horizontal W bus. Each cell then multiplies the value on the W bus by the current contents of its Dn. Next, every cell in the first row passes its product straight into Dn and outputs the product onto the corresponding vertical N bus. Every cell, in every row except the first, adds the value it reads on the N bus to its own product and stores the result in Dn. After the first clock cycle the contents of the array are:

$$
\begin{matrix}
[ & s[0,0].s[0,0]^{-1} & s[0,1].s[0,0]^{-1} & \ldots & s[0,h-1].s[0,0]^{-1} & s[0,h].s[0,0]^{-1} & ] \\
[ & s[1,0].s[1,0]^{-1} & s[1,1].s[1,0]^{-1} & \ldots & s[1,h-1]s[1,0]^{-1} & s[1,h]s[1,0]^{-1} & ] \\
[ & +s[0,0].s[0,0]^{-1} & +s[0,1].s[0,0]^{-1} & \ldots & +s[0,h-1].s[0,0]^{-1} & +s[0,h].s[0,0]^{-1} & ]
\end{matrix}
$$

-continued $$\begin{bmatrix} \ldots & & & & \\ s[h-1,0].s[h-1,0]^{-1} & s[h-1,1].s[h-1,0]^{-1} & \ldots & s[h-1,h-1].s[h-1,0]^{-1} & s[h-1,h] \\ +s[0,0].s[0,0]^{-1} & +s[0,1].s[0,0]^{-1} & \ldots & +s[0,h-1].s[0,0]^{-1} & +s[0,h].s[0,0]^{-1} \end{bmatrix}$$

During the i'th clock cycle after storing the h-matrix every SEC in the i'th column calculates the inverse of the contents of its Dn register. The result is put onto the corresponding horizontal W bus. Every cell, in every column, then multiplies the value it reads on the W bus by the current contents of its Dn. Every cell in the i'th row passes the product straight into Dn and then outputs its product onto the corresponding vertical N bus. Every cell, in every row except the i'th, adds the value it reads on the N bus to its own product and stores the result into its Dn.

This multiplication and addition continues for h clock cycles. Finally, one more multiplication is performed. However, this time the inverse is taken from every cell on the diagonal from s[0,0] to s[h−1, h−1], instead of vertically. After the final multiplication the contents of the final row will be the solution to the simultaneous equations.

Consider an example, taken from the encoding done in Section B above. The h-matrix (equation 26) for this example is:

$$[6\ 5\ 4\ (2 + 0 + 7 + 1)] \\ [5\ 3\ 1\ (5 + 2 + 7 + 1)] \\ [4\ 1\ 5\ (1 + 4 + 7 + 1)] \quad (55)$$

using the addition table (table 19)
[6 5 4 5]
[5 3 1 0]
[4 1 5 4]                                     (56)

1st clock cycle a) multiply (see table 20)
[0 6 5 6]
[0 5 3 2]
[0 4 1 0]                                     (57)

1st clock cycle b) add (see table 19)
[0 6 5 6]
[7 1 2 0]
[7 3 6 2]                                     (58)

2nd clock cycle a) multiply (see table 20)
[1 0 6 0]
[7 0 1 6]
[7 0 3 6]                                     (59)

2nd clock cycle b) add (see table 19)
[1 7 5 2]
[7 0 1 6]
[7 7 0 7]                                     (60)

3rd clock cycle a) multiply (see table 20)
[3 7 0 4]
[7 6 0 5]
[7 7 0 7]                                     (61)

3rd clock cycle b) add (see table 19)
[3 7 7 4]
[7 6 7 5]
[7 7 0 7]                                     (62)

4th clock cycle a) multiply (see table 20)
[0 7 7 1]
[7 0 7 6]
[7 7 0 7]                                     (63)

The contents of the final column are the values of the variables (1, 6, 7) as desired.

D. Broadband Network Application

As indicated previously, in a broadband network, data to be transmitted is organized into cells. The cells are routed through the network via a sequence of switches until the desired destination is reached. Since a broadband network utilizes optical fiber transmission facilities, impulse noise (e.g. lightning nears a copper telephone cable) is not a dominant source of data corruption. Instead, the dominant source of data corruption is congestion erasures. When a cell is routed through a busy switch in a broadband network, there is a chance of congestion. If a switch cannot reroute or buffer a cell, it will be lost. Thus, losses in a packet network tend to occur in the form of the loss of several successive cells.

Figure 6:
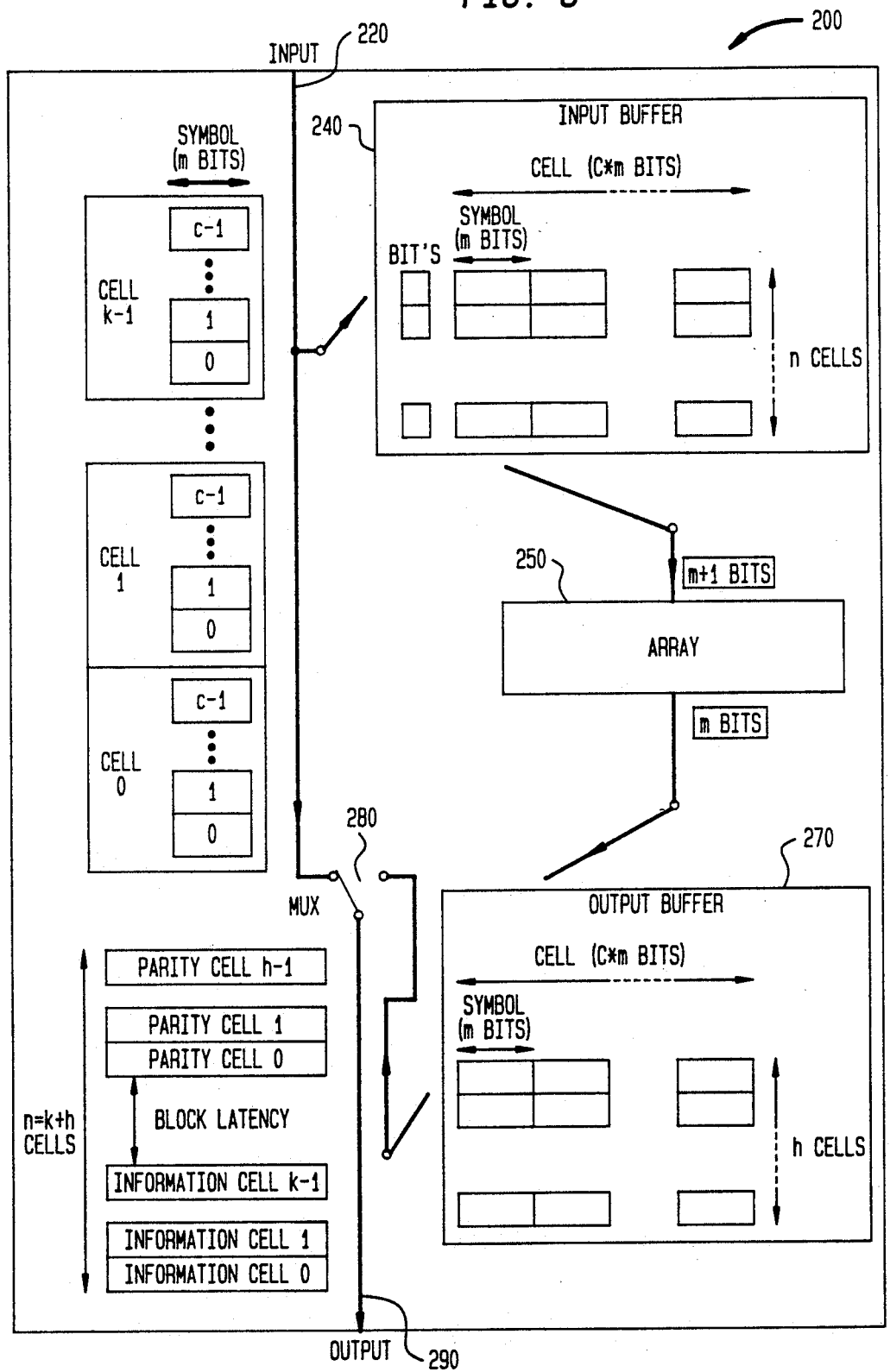
FIG. 6 illustrates the use of the FEC code of the present invention in a broadband network.

The inventive code described herein is especially useful to protect information from erasures caused by congestion overflow in the switches of a broadband network. FIG. 6 shows a block diagram of a cell based encoder/decoder 200 which utilizes the coding method of the present invention. The encoder/decoder 200 of FIG. 6 is used in a network where the minimum multiplexing unit is a cell where each cell has o symbols and each symbol has m bits.

The cells arrive at the encoder/decoder 200 at an input 220 In FIG. 6, k known cells are labeled cell 0, cell 1, .... cell k−1.

Parity cells are formed or erased cells are reconstructed using the inventive coding scheme In order to form the redundant parity cells or reconstruct erased cells, the known cells are simultaneously loaded into an input buffer 240, one cell at a time. The buffer 240 is organized into n words (i.e. lines) with c*m bits per word, so that each cell occupies one word of memory. Every word also has associated with it a one-bit flag. All flags are initially set high and are reset if a word is loaded. Words that are not loaded correspond to as yet undetermined parity cells or erased cells.

Once k known cells are loaded into the buffer, the coding array 250 (see FIG. 2) determines up to h parity or erased cells. To accomplish this, the leftmost column of symbols from the input buffer 240 is loaded into the coding array 250 along with the flag bits so that m+1 bits per symbol are loaded into the coding array 250. The coding array 250, which as shown in FIG. 2, comprises an input accumulation section, an equation generation section and a simultaneous equation solver, finds the h missing m-bit symbols in the leftmost column of symbols and outputs these m-bit symbols. The h m-bit symbols computed by the array 250 are loaded into the leftmost column of the output buffer 270. This process is repeated to find the missing symbols in every column of the input buffer 240 and the result is the formation of h words or cells in the output buffer 270.

The h cells are then transmitted to the multiplexer 280 where they are multiplexed with the k known cells in the proper sequence. Thus, as shown at the lower left of FIG. 6, the h missing cells (in this case parity cells) are shown as following the known (in this case information) cells to the output 290.

CONCLUSION

A simple FEC code which has a simple hardware implementation and which is particularly useful in broadband networks has been disclosed.

Finally, the above-described embodiments of the inventions are intended to be illustrative only. Numerous alternative embodiments may be devised by those skilled in the art without departing from the spirit and scope of the following claims.

I claim:

1. A method for communicating information in a broadband telecommunications network using a forward error correcting code comprising the steps of at an encoder, generating signals representing an n symbol codeword with m bits per symbol, said codeword comprising k known information symbols and h parity symbols having predetermined locations in said codeword, each of said symbols being chosen from a field of $2^m$ integers which is closed with respect to addition and multiplication, electronically generating signals representing a set of h simultaneous linear algebraic equations in terms of said k known information symbols and said h parity symbols, electronically determining signals which represent solutions of said set of simultaneous equations to determine said h parity symbols, transmitting said signals representing said codeword from said encoder comprising said k information symbols and said h parity symbols, receiving said transmitted signal representing said codeword at a decoder, and at said decoder, electronically correcting up to h symbol erasures of said codeword, said symbol erasures being a combination of erased information symbols and parity symbols, said correcting step comprising the step of electronically generating a set of linear algebraic simultaneous equations and electronically determining signals which represent solutions of said set of simultaneous equations to determine up to h symbol erasures.

2. The method of claim 1 where all of said integers are elements of a Galois Field and said set of equations is based on constraining a polynomial formed using the symbols of the codeword to be divisible by a generator polynomial.

3. The method of claim 1 wherein said field of integers obeys mod m arithmetic.

4. The method of claim 1 wherein said field of integers is a Galois Field.

5. The method of claim 1 for communicating information in a broadband telecommunication network using a forward error correcting code wherein, said receiving step entails loading said symbols of said codeword immediately for processing as said symbols are received without awaiting receipt of all codeword symbols.

6. A forward error correction coding circuit comprising:

an input accumulation circuit comprising
a linear array of interconnected input accumulation cells for receiving n input symbols of a codeword comprising k known symbols and h unknown symbols, for marking the positions of the unknown symbols and for forming weighted accumulations of the known symbols, an equation generation circuit comprising
a linear array of equation generation cells wherein each one of said equation generation cells corresponds to one of said input accumulation cells for receiving unknown symbol position markers and weighted accumulations of said known symbols from said corresponding input accumulation cell and for outputting a matrix corresponding to a system of simultaneous equations for determining said unknown symbols, and a simultaneous equation solver circuit comprising
a two dimensional array of interconnected simultaneous equation cells for receiving said matrix from said equation generation circuit and for solving said matrix to obtain said unknown symbols.

7. The circuit of claim 6 wherein said coding circuit is an encoder circuit and wherein said k known symbols are k information symbols to be transmitted and said h unknown symbols are h parity symbols to be used for erasure correction and having known locations in said codeword 8. The circuit of claim 6 wherein said coding circuit is a decoder and wherein said k known symbols are k received symbols and said h unknown symbols are h erasures.

9. The coding circuit of claim 6 wherein said input accumulation circuit comprises an array of h input accumulation cells linked together in a chain, each of said cells comprising a Galois Field adder and a Galois Field multiplier.

10. The coding circuit of claim 6 wherein said equation generation circuit comprises h equation generation cells linked together in a chain, each of said equation generation cells comprising a Galois field multiplier for calculating elements of said matrix 11. The coding circuit of claim 6 wherein said simultaneous equation circuit comprises an array of cells having h+1 columns and h rows interconnected by horizontal and vertical buses, each of said cells comprising a Galois Field multiplier and a Galois Field adder.

12. The forward error correction coding circuit of claim 6 wherein each of said codeword symbols received at said input accumulation cells is loaded upon receipt for further processing without awaiting receipt of all codeword symbols.

13. An electronic coding method for communicating signals in a broadband transmission network comprising the steps of at an encoder and a decoder, electronically producing signals representing a codeword having symbols with each symbol having m-bits, said codeword comprising k information symbols and h parity symbols, and where, at said encoder, k information symbols are of known value and location and h parity symbols are of known location but unknown value, and where, at said decoder, up to h of any of said n symbols are of known location but unknown value, all of the symbols of the codeword being elements of a closed field of integers with $2^m$ elements, said producing step further comprising at a coding circuit, electronically forming signals representing a matrix of values corresponding to a set of linear algebraic equations derived by constraining a polynomial formed using the codeword symbols as coefficients to be divisible by a generator polynomial, and electronically determining signals representing the value of said h unknown symbols at said encoder and up to h unknown symbols at said decoder by solving said matrix.

14. The electronic coding method of claim 12 for communicating signals in a broadband transmission network further comprising the steps of transmitting the codeword of n known symbols generated at said encoder to said decoder, and, at said decoder, generating up to h unknown symbols using non-erased symbols of the codeword received from said encoder.

* * * * *